US012644984B2

(12) United States Patent
    Warren et al.

(10) Patent No.: US 12,644,984 B2
(45) Date of Patent: Jun. 2, 2026

(54) OPTICAL ISOLATION APPARATUS

(71) Applicant: AMS INTERNATIONAL AG, Jona (CH)

(72) Inventors: Dwight Warren, Jona (CH); Larry Hall, Jona (CH); Michael Hofstaetter, Jona (CH)

(73) Assignee: AMS INTERNATIONAL AG, Rapperswil (CH)

( * ) Notice: Subject to any disclaimer, the term of this patent is extended or adjusted under 35 U.S.C. 154(b) by 1160 days.

(21) Appl. No.: 17/611,769

(22) PCT Filed: May 19, 2020

(86) PCT No.: PCT/EP2020/064012
    § 371 (c)(1),
    (2) Date: Nov. 16, 2021

(87) PCT Pub. No.: WO2020/234324
    PCT Pub. Date: Nov. 26, 2020

(65) Prior Publication Data
    US 2022/0244380 A1      Aug. 4, 2022

Related U.S. Application Data

(60) Provisional application No. 62/851,176, filed on May 22, 2019.

(51) Int. Cl.
    G01S 17/04        (2020.01)
    G01S 7/481        (2006.01)
    (Continued)

(52) U.S. Cl.
    CPC ............ G01S 17/04 (2020.01); G01S 7/4813 (2013.01); G01S 7/4814 (2013.01);
    (Continued)

(58) Field of Classification Search
    CPC ..... H01S 5/0262–0264; H01S 5/02234; H01S 5/0239; H10F 55/255; H10F 55/155;
    (Continued)

(56) References Cited

U.S. PATENT DOCUMENTS

| | | | |
|---|---|---|---|
| 6,590,152 B1 * | 7/2003 | Horio | H05K 9/0022 |
| | | | 257/E31.118 |
| D551,251 S * | 9/2007 | Horio | D14/496 |

(Continued)

FOREIGN PATENT DOCUMENTS

| | | |
|---|---|---|
| CN | 1773221 A | 5/2006 |
| CN | 103579216 A | 2/2014 |

(Continued)

OTHER PUBLICATIONS

Chinese Office Action for CN application No. 202080038011.2, dated Jan. 7, 2025, 17 pages.

(Continued)

*Primary Examiner* — Joshua King
(74) *Attorney, Agent, or Firm* — Tarolli, Sundheim, Covell & Tummino LLP

(57) ABSTRACT

An apparatus comprising: an optical emitter (104) mounted to a substrate (202); a transparent emitter housing portion (204) enclosing the optical emitter; a sensor (106) for detecting light, the sensor mounted to the substrate; a transparent sensor housing portion (206) enclosing the sensor; wherein the transparent emitter housing portion and the transparent sensor housing portion are horizontally separated on the substrate by an air gap.

15 Claims, 5 Drawing Sheets

Figure 1:
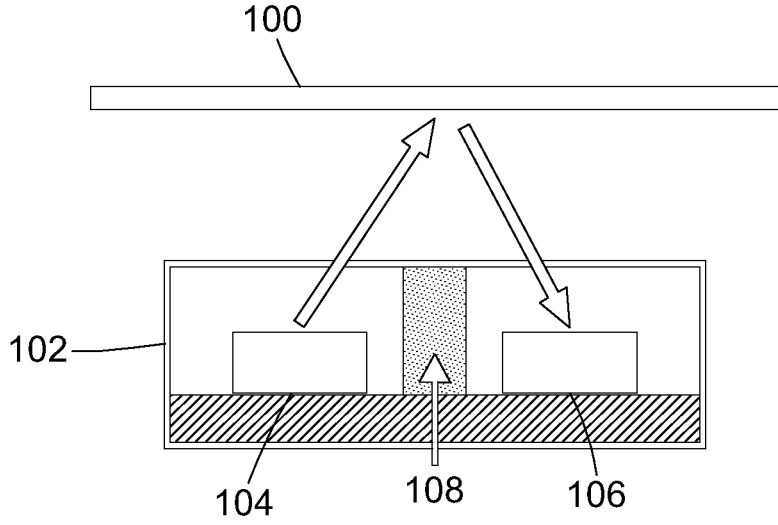

(51) Int. Cl.
  *H01S 5/02234* (2021.01)
  *H01S 5/0239* (2021.01)
  *H01S 5/026* (2006.01)
  *H10F 55/255* (2025.01)
  *H10F 77/50* (2025.01)

(52) U.S. Cl.
  CPC .......... *G01S 7/4816* (2013.01); *H10F 55/255* (2025.01); *H10F 77/50* (2025.01); *H01S 5/02234* (2021.01); *H01S 5/0239* (2021.01); *H01S 5/0262* (2013.01)

(58) Field of Classification Search
  CPC ...... H10F 77/50; H10F 39/103; H10F 39/804; G01S 7/4813
  See application file for complete search history.

(56) References Cited

U.S. PATENT DOCUMENTS

| | | | | |
|---|---|---|---|---|
| 11,662,462 | B2 * | 5/2023 | Uedaira | G01S 7/4813 |
| | | | | 356/5.01 |
| 2006/0097051 | A1 * | 5/2006 | Foo | G01D 5/34715 |
| | | | | 235/454 |
| 2006/0273437 | A1 | 12/2006 | Beer | |
| 2007/0241943 | A1 * | 10/2007 | Tan | G01D 5/34715 |
| | | | | 341/50 |
| 2007/0246646 | A1 * | 10/2007 | Lum | G01D 5/34715 |
| | | | | 250/231.13 |
| 2009/0039377 | A1 * | 2/2009 | Horio | G02B 6/4272 |
| | | | | 438/22 |
| 2010/0155586 | A1 * | 6/2010 | Chin | G01D 5/34715 |
| | | | | 250/231.1 |
| 2010/0181578 | A1 * | 7/2010 | Li | H10F 55/155 |
| | | | | 257/E31.095 |
| 2011/0204233 | A1 * | 8/2011 | Costello | G01S 17/04 |
| | | | | 250/338.4 |
| 2012/0104242 | A1 * | 5/2012 | Chin | G01D 5/34715 |
| | | | | 29/592.1 |
| 2012/0133956 | A1 * | 5/2012 | Findlay | H03K 17/941 |
| | | | | 257/E31.127 |
| 2012/0223231 | A1 * | 9/2012 | Nijaguna | G01J 1/0214 |
| | | | | 250/216 |
| 2013/0292706 | A1 * | 11/2013 | Costello | G01S 7/4813 |
| | | | | 257/82 |
| 2016/0240575 | A1 * | 8/2016 | Huang | G06V 40/1359 |
| 2016/0377762 | A1 * | 12/2016 | Uedaira | G01V 8/12 |
| | | | | 250/221 |
| 2017/0179588 | A1 | 6/2017 | Miyagawa | |
| 2017/0207352 | A1 * | 7/2017 | Ho | H10F 55/255 |

FOREIGN PATENT DOCUMENTS

| | | | | | |
|---|---|---|---|---|---|
| CN | 105527627 | A | | 4/2016 | |
| JP | H10154825 | A | * | 6/1998 | |
| JP | 3425310 | B2 | * | 7/2003 | |
| JP | 2013187357 | A | * | 9/2013 | |
| TW | 201347218 | A | * | 11/2013 | G01V 8/12 |
| TW | 1587003 | B | | 6/2017 | |
| WO | 2015199304 | A1 | | 12/2015 | |
| WO | WO-2021039214 | A1 | * | 3/2021 | G01D 5/26 |

OTHER PUBLICATIONS

International Search Report and Written Opinion for corresponding PCT Application No. PCT/EP2020/064012 dated Aug. 26, 2020.

Chinese Office Action for CN application No. 202080038011.2, dated Jun. 20, 2025, 19 pages.

Office Action for TW application No. 109117204, dated Mar. 2, 2026, 10 pages.

* cited by examiner

302

404

304

402 304

302

OPTICAL ISOLATION APPARATUS

RELATED APPLICATIONS

The present invention is a U.S. National Stage under 35 USC 371 patent application, claiming priority to Serial No. PCT/EP2020/064012, filed on 19 May 2020, which claims priority from U.S. Provisional Application No. 62/851,176, filed on 22 May 2019; the entireties of both are incorporated herein by reference.

FIELD OF THE DISCLOSURE

This disclosure relates to providing optical isolation between an optical emitter and a light sensor.

BACKGROUND

Mobile phones and other portable computing devices often include sensors to determine when an object is near the device. For example, many mobile phones use infrared proximity sensors to determine when a user holds the phone close to their head to make a phone call so that the screen can be disabled to save power and to disable the touch screen.

Proximity sensor modules, for example, use an emitter to bounce light off a nearby object and a sensor to detect the reflected light. Proximity sensors for mobile phones are very small modules, and the emitter is normally placed quite close to the sensor. Light generated by the emitter can blind the sensor if the emitter signal is not attenuated or optically isolated from the sensor.

A known proximity sensor module 102 is shown in FIG. 1. The proximity sensor module 102 comprises an optical emitter 104 which is arranged to emit light. The proximity sensor module 102 additionally comprises a sensor 106 to detect light reflected from an object 100. The proximity sensor module 102 comprises an opaque optical barrier 108 positioned between the optical emitter 104 and the sensor 106 to optically isolate the optical emitter 104 from the sensor 106.

SUMMARY

The inventors have identified that the known methods of optically isolating an optical emitter from a sensor by adding an opaque optical barrier between the optical emitter and the sensor complicates the manufacturing process and requires additional materials to produce the device.

According to one aspect of the present disclosure there is provided an apparatus (e.g. in the form of an optical sensor module) comprising: an optical emitter mounted to a substrate; a transparent emitter housing portion enclosing the optical emitter; a sensor for detecting light, the sensor mounted to the substrate; a transparent sensor housing portion enclosing the sensor; wherein the transparent emitter housing portion and the transparent sensor housing portion are horizontally separated on the substrate by an air gap.

By avoiding the need for an opaque optical barrier between the optical emitter and the sensor, the manufacturing process is simplified and the amount of materials required to produce the optical sensor module is reduced, whilst at the same time ensuring that the optical emitter and sensor are optically isolated.

In some implementations, the transparent emitter housing portion comprises a side wall adjacent said air gap that extends perpendicular to the substrate, and the transparent sensor housing portion comprises a side wall adjacent said air gap that extends perpendicular to the substrate.

The inventors have identified that by introducing a slope to the opposing side walls of the transparent emitter housing and/or the transparent sensor housing adjacent the air gap it is possible to reduce the horizontal separation distance between the transparent emitter housing and the transparent sensor housing. This advantageously enables the size of the optical sensor module to be reduced.

That is, the transparent emitter housing portion may comprise a sloped side wall adjacent said air gap. Additionally or alternatively, the transparent sensor housing portion may comprise a sloped side wall adjacent said air gap.

To optimise the optical isolation and simplify the manufacturing process. The sloped side wall of the transparent emitter housing portion may be at an angle relative to a vertical axis of 45 degrees or less, preferably 30 degrees or less, more preferably 15 degrees or less, and still more preferably 10 degrees or less. The sloped side wall of the transparent sensor housing portion may be at an angle relative to a vertical axis of 45 degrees or less, preferably 30 degrees or less.

In some implementations, the sloped side wall of the transparent emitter housing portion has an edge coupled to the substrate. In other implementations, the sloped side wall of the transparent emitter housing portion has an edge coupled to the transparent sensor housing portion. In other implementations, the sloped side wall of the transparent emitter housing portion has an edge coupled to a transparent intermediary housing portion joining the transparent emitter housing portion and the transparent sensor housing portion.

It is advantageous to make the horizontal separation distance between the transparent emitter housing and the transparent sensor housing as small as possible so that the size of the optical sensor module to be minimised. However the inventors have identified that if the horizontal separation distance between the transparent emitter housing and the transparent sensor housing is reduced too much, light emitted by the optical emitter can exit the transparent emitter housing portion and hit the transparent sensor housing portion causing it to reflect back into the transparent sensor housing portion and be incident on the sensor.

To resolve this issue, the inventors have identified that adding chamfers to the side walls on one or both sides of the air gap can improve the optical isolation such that the small horizontal separation distance between the transparent emitter housing and the transparent sensor housing can be maintained.

Thus in implementations whereby the transparent emitter housing portion comprises a sloped side wall adjacent said air gap, the transparent emitter housing portion may comprise a further sloped side wall adjacent said air gap which extends from the sloped sidewall of the transparent emitter housing portion to an upper surface of the transparent emitter housing portion. The further sloped side wall of the transparent emitter housing portion may be at an angle relative to the vertical axis that is greater than the angle of the sloped sidewall of the transparent emitter housing portion relative to the vertical axis. In particular, the further sloped side wall of the transparent emitter housing portion may be at an angle relative to the vertical axis in a range of 30-60 degrees.

Furthermore, in implementations whereby the transparent sensor housing portion comprises a sloped side wall adjacent said air gap, the transparent sensor housing portion may comprise a further sloped side wall adjacent said air gap which extends from the sloped sidewall of the transparent sensor housing portion to an upper surface of the transparent sensor housing portion. The further sloped side wall of the transparent sensor housing portion may be at an angle relative to the vertical axis that is greater than the angle of the sloped sidewall of the transparent sensor housing portion relative to the vertical axis. In particular, the further sloped side wall of the transparent sensor housing portion may be at an angle relative to the vertical axis in a range of 30-60 degrees.

In some implementations, there is a horizontal separation distance between the optical emitter and the sensor is in a range of 1.5 mm to 3 mm, preferably in a range of 2 mm to 3 mm.

The optical emitter may be a laser diode, for example a vertical-cavity surface-emitting laser. The sensor may be a photodiode.

According to another aspect of the present disclosure there is provided a mobile computing device comprising the apparatus described herein.

These and other aspects will be apparent from the embodiments described in the following. The scope of the present disclosure is not intended to be limited by this summary nor to implementations that necessarily solve any or all of the disadvantages noted.

BRIEF DESCRIPTION OF THE PREFERRED EMBODIMENTS

Figure 2:
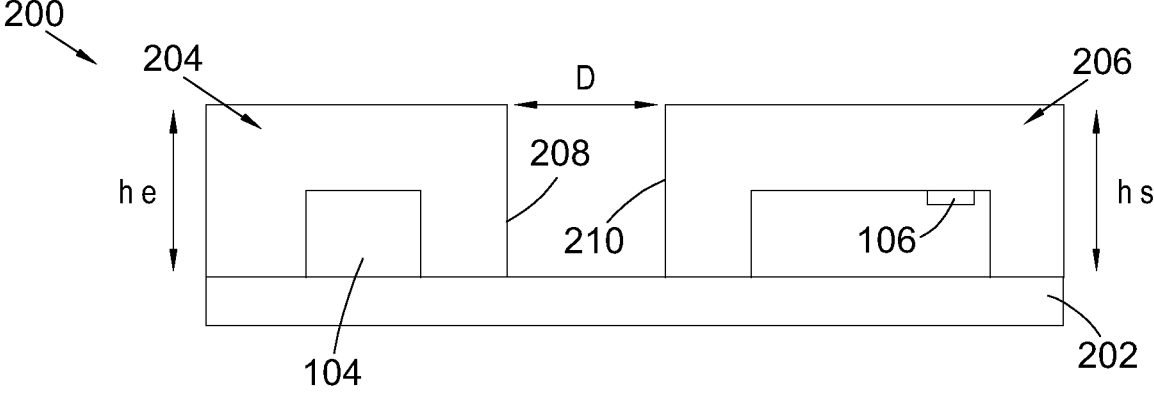

Some embodiments of the disclosure will now be described by way of example only and with reference to the accompanying drawings, in which:

FIG. 1 schematically depicts in cross section a known proximity sensor module provided with a mechanical opaque optical barrier to isolate an emitter from a sensor within the proximity sensor module;

FIG. 2 schematically depicts an apparatus having a transparent emitter housing portion comprising a side wall adjacent an air gap that extends perpendicular to a substrate, and a transparent sensor housing portion comprising a side wall adjacent the air gap that extends perpendicular to the substrate.

Figure 3A:
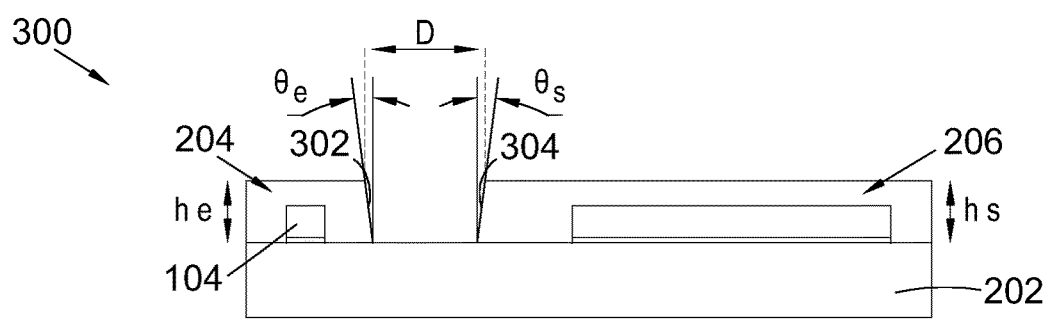
Figure 3B:
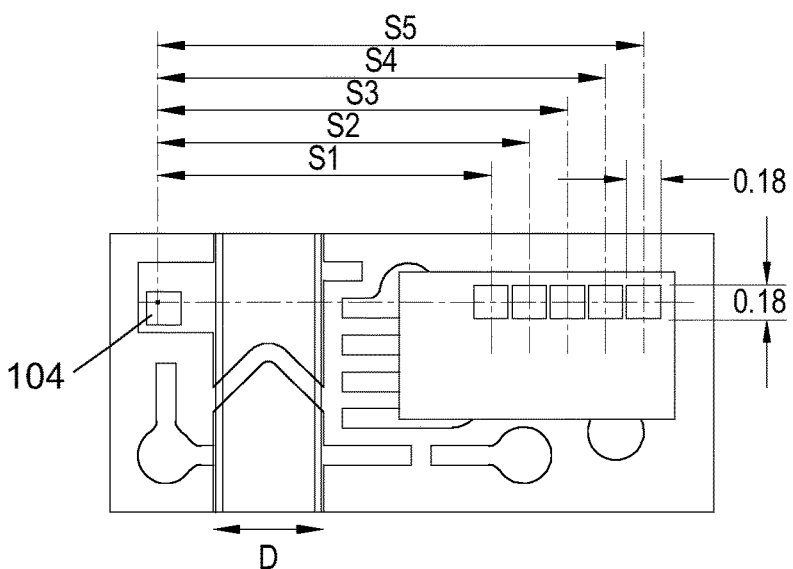
Figure 3C:
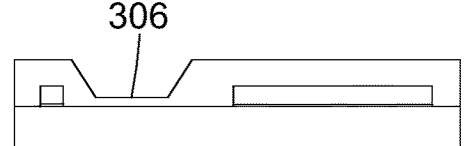
Figure 4A:
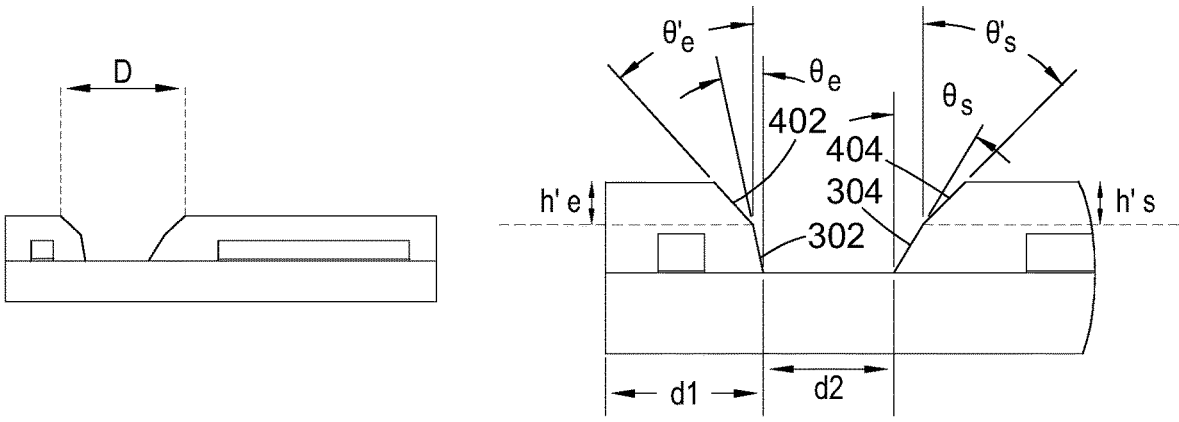
Figure 4B:
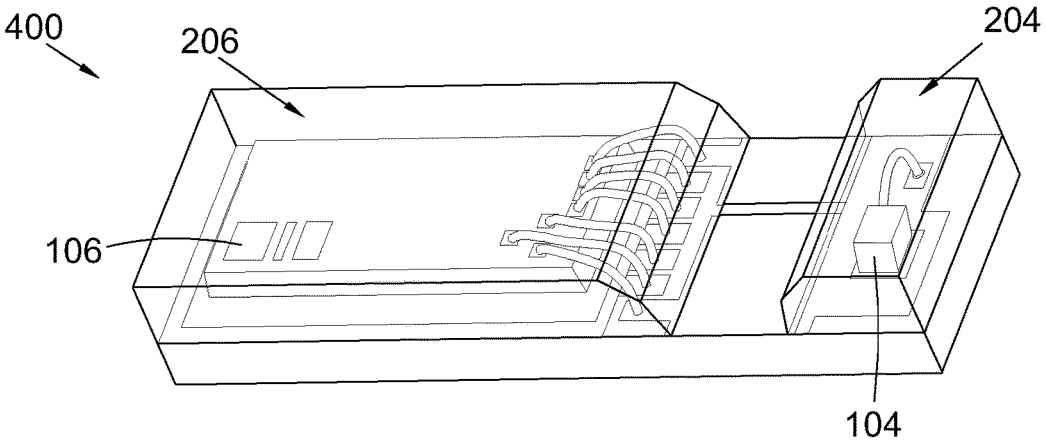
Figure 4C:
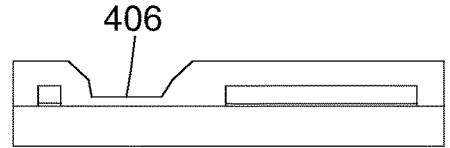
Figure 5A:
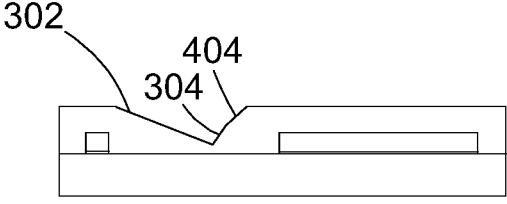
Figure 5B:
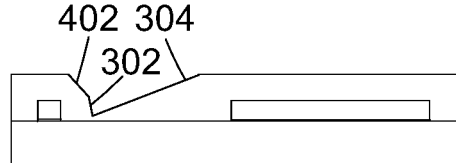
Figure 6:
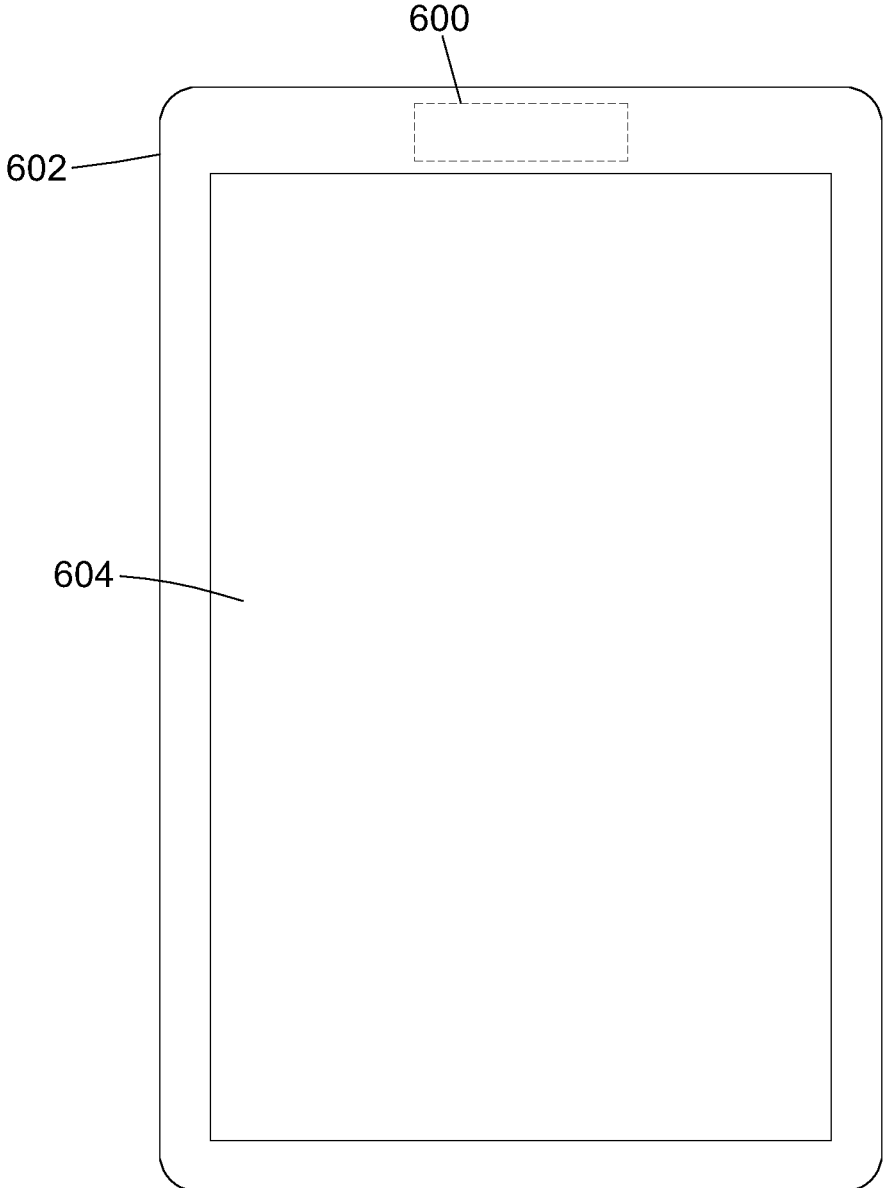

FIG. 3a schematically depicts an apparatus having a transparent emitter housing portion comprising a sloped side wall adjacent an air gap, and a transparent sensor housing portion comprising a sloped side wall adjacent the air gap FIG. 3b illustrates emitter to sensor spacing;

FIG. 3c schematically depicts a variant of the apparatus shown in FIG. 3a having a transparent intermediary housing portion joining the transparent emitter housing portion and the transparent sensor housing portion;

FIGS. 4a and 4b schematically depicts an apparatus whereby the sloped side wall of the transparent emitter housing portion and the sloped side wall of the transparent sensor housing portion are both provided with a chamfer;

FIG. 4c schematically depicts a variant of the apparatus shown in FIGS. 4a and 4b having a transparent intermediary housing portion joining the transparent emitter housing portion and the transparent sensor housing portion;

FIG. 5a schematically depicts an apparatus whereby the sloped side wall of the transparent emitter housing portion is not provided with a chamfer and the sloped side wall of the transparent sensor housing portion is provided with a chamfer;

FIG. 5b schematically depicts an apparatus whereby the sloped side wall of the transparent emitter housing portion is provided with a chamfer and the sloped side wall of the transparent sensor housing portion is not provided with a chamfer; and FIG. 6 illustrates a computing device comprising the apparatus described herein.

DETAILED DESCRIPTION OF THE PREFERRED EMBODIMENTS

Generally speaking, the disclosure obviates the need for an opaque mechanical barrier for optical isolation between an optical emitter and a sensor.

Some examples of the solution are given in the accompanying figures.

Embodiments described herein relate to an apparatus comprising an optical emitter 104 mounted to a substrate 202. A transparent emitter housing portion 204 encloses the optical emitter 104. The optical emitter 104 emits light (e.g. infrared light). The optical emitter 104 may be a laser diode, for example a vertical-cavity surface-emitting laser (VCSEL). It will be appreciated that the optical emitter 104 may be any light emitting component and is not limited to the examples referred to herein. The apparatus also comprises a light sensor 106 for detecting light. A transparent sensor housing portion 206 encloses the sensor 106. The sensor 106 may for example be a photodiode. It will be appreciated that the sensor 106 may be any light sensitive component and is not limited to the examples referred to herein. In embodiments, the transparent emitter housing portion 204 and the transparent sensor housing portion 206 are horizontally separated on the substrate 202 by an air gap.

The transparent emitter housing portion 204 has a height, $h_e$, above the substrate 202. The transparent sensor housing portion 206 has a height, $h_s$, above the substrate 202. In implementations the height, $h_e$, of the transparent emitter housing portion 204 may be the same as the height, $h_s$, of the transparent sensor housing portion 206. In other implementations, the height, $h_e$, of the transparent emitter housing portion 204 is different to the height, $h_s$, of the transparent sensor housing portion 206.

In embodiments the transparent emitter housing portion 204 and the transparent sensor housing portion 206 are designed and positioned to divert light rays emitted from the optical emitter 104 away from the sensor 106 to reduce optical crosstalk.

We first refer to FIG. 2 which schematically depicts an apparatus 200 in the form of an optical sensor module.

As shown in FIG. 2, in the apparatus 200 the transparent emitter housing portion 204 comprises a side wall 208 adjacent the air gap that extends perpendicular to the substrate 202, and the transparent sensor housing portion 206 comprises a side wall 210 adjacent the air gap that extends perpendicular to the substrate 202.

No opaque barrier is provided in the air gap to optically isolate the light emitted from the optical emitter 104 being incident on the sensor 106. To optically isolate the light emitted from the optical emitter 104 being incident on the sensor 106 the horizontal separation distance, D, between the transparent emitter housing portion 204 and the transparent sensor housing portion 206 needs to be sufficiently large. In embodiments, the horizontal separation distance, D, is measured between (i) an edge of the transparent emitter housing portion 204 at which a wall of the transparent emitter housing portion 204 that is adjacent the air gap extends downwards towards the substrate 202 from the upper surface of the transparent emitter housing portion 204; and (ii) an edge of the transparent sensor housing portion 206 at which a wall of the transparent sensor housing portion 206 that is adjacent the air gap extends downwards towards the substrate 202 from the upper surface of the transparent sensor housing portion 206.

In the apparatus 200 shown in FIG. 2, the perpendicular side wall 208 of transparent emitter housing portion has an edge coupled to the substrate 202 and the perpendicular side wall 210 of transparent sensor housing portion also has an edge coupled to the substrate 202. In these implementations the optical emitter 104 and the sensor 106 are housed in their own respective transparent housings.

In other implementations (not shown in the figures), the perpendicular side wall 208 of transparent emitter housing portion has a lower edge (closest the substrate) coupled to a transparent intermediary housing portion and the perpendicular side wall 210 of transparent sensor housing portion has a lower edge (closest the substrate) coupled to the transparent intermediary housing portion. That is, the transparent intermediary housing portion joins the transparent emitter housing portion 204 and the transparent sensor housing portion 206. In these implementations the optical emitter 104 and the sensor 106 are housed in a single transparent housing.

The apparatus 200 is advantageous in that the optical isolation between the optical emitter 104 and the sensor 106 is provided and manufacturing of the apparatus 200 is simplified.

The inventors have identified that by introducing a slope to the opposing side wall of the transparent emitter housing portion and/or the transparent sensor housing portion adjacent the air gap it is possible to reduce the horizontal separation distance, D. This advantageously enables the size of the optical sensor module to be reduced.

The horizontal separation distance, D, between the transparent emitter housing portion 204 and the transparent sensor housing portion 206 that is shown in FIG. 2 may for example be in the range 0.3-2 mm.

FIG. 3a schematically depicts an apparatus 300 whereby the transparent emitter housing portion 204 comprises a sloped side wall 302 adjacent the air gap, and the transparent sensor housing portion 206 comprising a sloped side wall 304 adjacent the air gap.

In implementations whereby the transparent emitter housing portion 204 comprises a sloped side wall 302 adjacent the air gap, the sloped side wall 302 of the transparent emitter housing portion 204 is at an angle $\theta_e$ relative to a vertical axis of 45 degrees or less, preferably 30 degrees or less, more preferably 15 degrees or less, and still more preferably 10 degrees or less.

In implementations whereby the transparent sensor housing portion 206 comprises a sloped side wall 304 adjacent the air gap, the sloped side wall 304 of the transparent sensor housing portion 206 is at an angle $\theta_s$ relative to a vertical axis of 45 degrees or less, preferably 30 degrees or less.

No opaque barrier is provided in the air gap to optically isolate the light emitted from the optical emitter 104 being incident on the sensor 106. The optical crosstalk detected by the sensor 106 was found to vary in dependence on the horizontal separation distance between the optical emitter 104 and the sensor 106 and the angles $\theta_e$ and $\theta_s$. The horizontal separation distance between the optical emitter 104 and the sensor 106 is preferably in a range of 1.5 mm to 3 mm, preferably in a range of 2 mm to 3 mm.

FIG. 3b illustrates example distances between the optical emitter 104 and the sensor 106 and shows a spacing S1 of 1.79 mm, a spacing S2 of 2.00 mm, a spacing S3 of 2.21 mm, a spacing S4 of 2.41 mm and a spacing S5 of 2.62 mm.

For example using the spacing S5 of 2.62 mm between the optical emitter 104 and the sensor 106 the apparatus 300 may be provided with a sloped side wall 302 at an angle $\theta_e$ relative to a vertical axis of 10° and a sloped side wall 304 at an angle $\theta_s$ relative to a vertical axis of 30° to provide an optimal trade-off between minimising crosstalk (optimising the optical isolation) and ease of manufacture. It will be appreciated that these example angle values may be used with different spacings between the optical emitter 104 and the sensor 106. FIG. 3b illustrates the use of a sensor 106 with a footprint of 1.8 mm×1.8 mm but it will be appreciated that this is merely an example.

In the apparatus 300 shown in FIG. 3a, the sloped side wall 302 of the transparent emitter housing portion 204 has an edge coupled to the substrate 202 and the sloped side wall 304 of transparent sensor housing portion 206 also has an edge coupled to the substrate 202. In these implementations the optical emitter 104 and the sensor 106 are housed in their own respective transparent housings.

In other implementations (as shown in FIG. 3c), the sloped side wall 302 of the transparent emitter housing portion 204 has a lower edge (closest the substrate) coupled to a transparent intermediary housing portion 306 and the sloped side wall 304 of transparent sensor housing portion 206 also has a lower edge (closest the substrate) coupled to the transparent intermediary housing portion 306. That is, the transparent intermediary housing portion 306 joins the transparent emitter housing portion 204 and the transparent sensor housing portion 206. In these implementations the optical emitter 104 and the sensor 106 are housed in a single transparent housing.

The horizontal separation distance, D, between the transparent emitter housing portion 204 and the transparent sensor housing portion 206 that is shown in FIG. 3a may for example be in the range 0.3-2 mm.

In order to make the horizontal separation distance between the transparent emitter housing portion 204 and the transparent sensor housing portion 206 as small as possible (so that the size of the optical sensor module can be minimised) chamfers can be added to the side walls on one or both sides of the air gap so as to prevent light emitted by the optical emitter exiting the transparent emitter housing portion 204 and hitting the transparent sensor housing portion 206 causing it to reflect back into the transparent sensor housing portion and be incident on the sensor 106.

FIG. 4a schematically depicts an apparatus 400 whereby the transparent emitter housing portion 204 comprises a sloped side wall 302 adjacent the air gap which is at an angle $\theta_e$ relative to a vertical axis. The transparent emitter housing portion 204 further comprises a further sloped side wall 402 adjacent the air gap which extends from the sloped sidewall 302 of the transparent emitter housing portion to an upper surface of the transparent emitter housing portion 204. The further sloped side wall 402 is at an angle $\theta'_e$ relative to a vertical axis. Preferably the angle $\theta'_e$ is greater than the angle $\theta_e$. Whilst FIG. 4a shows the further sloped side wall 402 extending from a sloped sidewall, in other implementation the sidewall 302 may be perpendicular to the substrate 202. The angle $\theta'_e$ relative to the vertical axis may be in a range of 30-60 degrees. For example the angle $\theta'_e$ may be 45°, however angles greater or less than 45° may be used for the angle $\theta'_e$.

As shown in FIG. 4a, the chamfer of the transparent emitter housing portion 204 has a vertical height h'e. The vertical height h'e is measured between (i) a lower edge of the further sloped side wall 402 that is coupled to the sloped side wall 302; and (ii) an upper edge of the further sloped side wall 402 that is coupled to the upper surface of the transparent emitter housing portion 204.

In FIG. 4a the transparent sensor housing portion 206 comprises a sloped side wall 304 adjacent the air gap which is at an angle $\theta_s$ relative to a vertical axis. The transparent sensor housing portion 206 further comprises a further sloped side wall 404 adjacent the air gap which extends from the sloped sidewall 304 of the transparent sensor housing portion 206 to an upper surface of the transparent sensor housing portion 206. The further sloped side wall 404 is at an angle $\theta'_s$ relative to a vertical axis. Preferably the angle $\theta'_s$ is greater than the angle $\theta_s$. Whilst FIG. 4a shows the further sloped side wall 404 extending from a sloped sidewall, in other implementation the sidewall 304 may be perpendicular to the substrate 202. The angle $\theta'_s$ relative to the vertical axis may be in a range of 30-60 degrees. For example the angle $\theta'_s$ may be 45°, however angles greater or less than 45° may be used for the angle $\theta'_s$. In some implementations the angles $\theta'_e$ and $\theta'_s$ are the same, however they may be different.

As shown in FIG. 4a, the chamfer of the transparent sensor housing portion 206 has a vertical height h's. The vertical height h's is measured between (i) a lower edge of the further sloped side wall 404 that is coupled to the sloped side wall 304; and (ii) an upper edge of the further sloped side wall 404 that is coupled to the upper surface of the transparent sensor housing portion 206.

The apparatus 400 may be provided with a sloped side wall 302 at an angle $\theta_e$ relative to a vertical axis of 10° and a sloped side wall 304 at an angle $\theta_s$ relative to a vertical axis of 30°, with $\theta'_e$ and $\theta'_s$ being 45° to provide an optimal trade-off between minimising crosstalk (optimising the optical isolation) and ease of manufacture.

By way of comparative example, during testing it was found that with the optical emitter 104 emitting 1 W of light, the sensor 106 of apparatus 300 (with no chamfers) provided with a sloped side wall 302 at an angle $\theta_e$ relative to a vertical axis of 10° and a sloped side wall 304 at an angle $\theta_s$ relative to a vertical axis of 30° experienced crosstalk of 13.967 nW of light being incident on the sensor 106. In contrast, in the same test conditions, the sensor 106 of apparatus 400 provided with a sloped side wall 302 at an angle $\theta_e$ relative to a vertical axis of 10° and a sloped side wall 304 at an angle $\theta_s$ relative to a vertical axis of 30°, with $\theta'_e$ and $\theta'_s$ being 45°, and with h'e and h's being 0.10 mm, experienced crosstalk of 6.326 nW of light being incident on the sensor 106. The sensor 106 of apparatus 400 provided with a sloped side wall 302 at an angle $\theta_e$ relative to a vertical axis of 10° and a sloped side wall 304 at an angle $\theta_s$ relative to a vertical axis of 30°, with $\theta'_e$ and $\theta'_s$ being 45°, and with h'e and h's being 0.15 mm, experienced crosstalk of 4.720 nW of light being incident on the sensor 106. Thus adding chamfers to the sidewalls of the airgap can improve the optical isolation. Furthermore the height of the chamfers can be controlled to improve the optical isolation.

It will be appreciated that the values of the chamfer heights h'e & h's referred to above may be used with other slope angles than those referred to in the examples above.

The horizontal separation distance, D, between the transparent emitter housing portion 204 and the transparent sensor housing portion 206 that is shown in FIG. 4a may for example be in the range 0.3-2 mm.

The length, d1, of the transparent emitter housing portion 204 may be less than 1 mm. For example d1, may be 0.6 mm.

FIG. 4b provides a perspective view of the apparatus 400 shown in FIG. 4a. As can be seen from FIGS. 4a and 4b, no opaque barrier is provided in the air gap to optically isolate the light emitted from the optical emitter 104 being incident on the sensor 106.

In the apparatus 400 shown in FIGS. 4a and 4b, the side wall 302 of the transparent emitter housing portion 204 has an edge coupled to the substrate 202 and the side wall 304 of transparent sensor housing portion 206 also has an edge coupled to the substrate 202. In these implementations the optical emitter 104 and the sensor 106 are housed in their own respective transparent housings. The length, d2, between the edge of the transparent emitter housing portion 204 coupled to the substrate 202 and the edge of the transparent sensor housing portion 204 coupled to the substrate 202 may be less than 1 mm. For example, d2 may be 0.5 mm.

In other implementations (as shown in FIG. 4c), the side wall 302 of the transparent emitter housing portion 204 has a lower edge (closest the substrate) coupled to a transparent intermediary housing portion 406 and the side wall 304 of transparent sensor housing portion 206 also has a lower edge (closest the substrate) coupled to the transparent intermediary housing portion 406. That is, the transparent intermediary housing portion 406 joins the transparent emitter housing portion 204 and the transparent sensor housing portion 206. In these implementations the optical emitter 104 and the sensor 106 are housed in a single transparent housing.

FIG. 5a schematically depicts a variant of the apparatus 400 shown in FIGS. 4a-c whereby only the sloped side wall 304 of the transparent sensor housing portion 206 is provided with a chamfer (the sloped side wall 302 of the transparent emitter housing portion 204 is not provided with a chamfer). As shown in FIG. 5a, a lower edge (closest the substrate) of the the sloped side wall 302 of the transparent emitter housing portion 204 that is adjacent the air gap is coupled to a lower edge (closest the substrate) of the sloped side wall 304 of the transparent sensor housing portion 206 that is adjacent the air gap. Thus in this arrangement the optical emitter 104 and the sensor 106 are housed in a single transparent housing.

FIG. 5b schematically depicts a variant of the apparatus 400 shown in FIGS. 4a-c whereby only the sloped side wall 302 of the transparent emitter housing portion 204 is provided with a chamfer (the sloped side wall 304 of the transparent sensor housing portion 206 is not provided with a chamfer). As shown in FIG. 5b, a lower edge (closest the substrate) of the the sloped side wall 302 of the transparent emitter housing portion 204 that is adjacent the air gap is coupled to a lower edge (closest the substrate) of the sloped side wall 304 of the transparent sensor housing portion 206 that is adjacent the air gap. Thus in this arrangement the optical emitter 104 and the sensor 106 are housed in a single transparent housing.

As can be seen from FIGS. 5a and 5b, no opaque barrier is provided in the air gap to optically isolate the light emitted from the optical emitter 104 being incident on the sensor 106.

The implementations described herein avoid the additional cost of adding an opaque barrier to the module. By adjusting the width of the gap and the gap wall angles, optical isolation between the emitter and detector (sensor 106) can be optimized.

The present techniques can be used, for example, in mobile phone applications (e.g., proximity sensing) as well as other applications involving a light emitting component and a light sensitive component within close proximity of each other.

FIG. 6 illustrates a computing device 602 comprising an apparatus 600 according to any of the embodiments described herein. For example apparatus 600 may correspond to apparatus 200, 300 or 400. The computing device 602 shown in FIG. 6 is a mobile phone with a display 604, however it will be appreciated that an apparatus according to embodiments of the present disclosure may be incorporated into other types of computing device (whether mobile or not). For example, the computing device 602 may be a wearable device. As shown in FIG. 6, in the example of the computing device 602 being a mobile phone 602, the apparatus 600 is positioned so that the sensor 106 is able to determine when a user holds the mobile phone close to their head to make a phone call so that the screen can be disabled to save power and to disable the touch screen. That is, light emitted by the optical emitter 104 exits the mobile phone 602 by way of an aperture and light reflected from an object in the environment of the mobile phone 602 (e.g. a user's head) travels through the same (or different) aperture to be incident on the light sensor 106

In any of the implementations described above, whilst side walls have been described and shown as being flat, it will be appreciated that curved sidewalls may also be used.

The skilled person will understand that in the preceding description and appended claims, positional terms such as 'above', 'along', 'side', etc. are made with reference to conceptual illustrations, such as those shown in the appended drawings. These terms are used for ease of reference but are not intended to be of limiting nature. These terms are therefore to be understood as referring to an object when in an orientation as shown in the accompanying drawings.

Although the disclosure has been described in terms of preferred embodiments as set forth above, it should be understood that these embodiments are illustrative only and that the claims are not limited to those embodiments. Those skilled in the art will be able to make modifications and alternatives in view of the disclosure which are contemplated as falling within the scope of the appended claims. Each feature disclosed or illustrated in the present specification may be incorporated in any embodiments, whether alone or in any appropriate combination with any other feature disclosed or illustrated herein.

LIST OF REFERENCE NUMERALS

100 Object
102 Proximity sensor module
104 Optical emitter
106 Sensor
108 Opaque optical barrier
200 Apparatus
202 Substrate
204 Transparent emitter housing portion
206 Transparent sensor housing portion
208 Perpendicular side wall of transparent emitter housing portion
210 Perpendicular side wall of transparent sensor housing portion
300 Apparatus
302 Sloped side wall of transparent emitter housing portion
304 Sloped side wall of transparent sensor housing portion
306 Transparent intermediary housing portion
400 Apparatus

402 Further sloped side wall of transparent emitter housing portion
404 Further sloped side wall of transparent sensor housing portion
406 Transparent intermediary housing portion
600 Apparatus
602 Computing device
604 Display

The invention claimed is:

1. An apparatus comprising:
an optical emitter mounted to a substrate;
a transparent emitter housing portion enclosing the optical emitter and having an emitter housing sloped side wall extending from the substrate with a first emitter housing slope to a further emitter housing sloped side wall extending to an upper surface of the transparent emitter housing portion with a second emitter housing slope, wherein the first emitter housing slope is a constant slope and the second emitter housing slope is a constant slope less than the first emitter housing slope;
a sensor for detecting light, the sensor mounted to the substrate; and
a transparent sensor housing portion enclosing the sensor and having a sensor housing sloped side wall extending from the substrate with a first sensor housing slope to a further sensor housing sloped side wall extending to an upper surface of the transparent sensor housing portion with a second sensor housing slope, wherein the first sensor housing slope is a constant slope and the second sensor housing slope is a constant slope less than the first sensor housing slope, and wherein the transparent emitter housing portion and the transparent sensor housing portion are horizontally separated on the substrate by an air gap.

2. The apparatus of claim 1, wherein the emitter housing sloped side wall of the transparent emitter housing portion is at an angle relative to a vertical axis of 1 degree to 45 degrees.

3. The apparatus of claim 1, wherein the emitter housing sloped side wall of the transparent emitter housing portion has an edge coupled to the substrate.

4. The apparatus of claim 1, wherein the emitter housing sloped side wall of the transparent emitter housing portion has an edge coupled to the transparent sensor housing portion.

5. The apparatus of claim 1, wherein the emitter housing sloped side wall of the transparent emitter housing portion has an edge coupled to a transparent intermediary housing portion joining the transparent emitter housing portion and the transparent sensor housing portion.

6. The apparatus of claim 1, wherein the further emitter housing sloped side wall of the transparent emitter housing portion is at an angle relative to the vertical axis that is greater than the angle of the emitter housing sloped sidewall of the transparent emitter housing portion relative to the vertical axis.

7. The apparatus of claim 1, wherein the further emitter housing sloped side wall of the transparent emitter housing portion is at an angle relative to the vertical axis in a range of 30-60 degrees.

8. The apparatus of claim 1, wherein the sensor housing sloped side wall of the transparent sensor housing portion is at an angle relative to a vertical axis of 1 degree to 45 degrees.

9. The apparatus of claim 1, wherein the further sensor housing sloped side wall of the transparent sensor housing portion is at an angle relative to the vertical axis that is greater than the angle of the sensor housing sloped sidewall of the transparent sensor housing portion relative to the vertical axis.

10. The apparatus of claim 1, wherein the further sensor housing sloped side wall of the transparent sensor housing portion is at an angle relative to the vertical axis in a range of 30-60 degrees.

11. The apparatus of claim 1, wherein a horizontal separation distance between the optical emitter and the sensor is in a range of 1.5 mm to 3 mm.

12. The apparatus of claim 1, wherein no opaque barrier is provided in said air gap to optically isolate light emitted from the optical emitter being incident on the sensor.

13. The apparatus of claim 1, wherein the optical emitter is a laser diode.

14. The apparatus of claim 1, wherein the sensor is a photodiode.

15. A computing device comprising the apparatus of claim 1.

* * * * *